US012811377B2

(12) United States Patent
Henderson

(10) Patent No.: US 12,811,377 B2
(45) Date of Patent: Nov. 24, 2026

(54) LOCKING APPARATUS FOR OUTDOOR NETWORK TERMINAL

(71) Applicant: FRONTIER COMMUNICATIONS HOLDINGS, LLC, Dallas, TX (US)

(72) Inventor: Franklin C. Henderson, May, TX (US)

(73) Assignee: Verizon Patent and Licensing Inc., Basking Ridge, NJ (US)

( * ) Notice: Subject to any disclaimer, the term of this patent is extended or adjusted under 35 U.S.C. 154(b) by 492 days.

(21) Appl. No.: 18/229,865

(22) Filed: Aug. 3, 2023

(65) Prior Publication Data

US 2025/0047086 A1 Feb. 6, 2025

(51) Int. Cl.
*H02G 3/08* (2006.01)
*H05K 5/02* (2006.01)

(52) U.S. Cl.
CPC ........... *H02G 3/086* (2013.01); *H05K 5/0221* (2013.01)

(58) Field of Classification Search
CPC .......... H02G 3/08; H02G 3/081; H02G 3/086; H05K 5/02; H05K 5/00; H05K 5/0221; H05K 5/0217; H05K 5/0247; H01R 13/46
USPC ........ 174/50, 520, 559, 66, 67; 220/3.2–3.9, 220/4.02, 241, 242; 361/600, 601, 361/679.01, 679.02
See application file for complete search history.

(56) References Cited

U.S. PATENT DOCUMENTS 6,343,009 B1 * 1/2002 Liu ...................... G11B 33/124 361/819
6,798,653 B2 * 9/2004 Chen ...................... G06F 1/187 248/220.31
7,038,907 B2 * 5/2006 Chen ...................... G06F 1/187 361/679.33
8,226,050 B2 * 7/2012 Ye ...................... G11B 33/124 248/27.3
8,228,687 B2 * 7/2012 Huang ................. G11B 33/124 361/810
8,496,493 B2 * 7/2013 Lin ...................... G06F 1/187 439/345
11,654,843 B2 * 5/2023 Ukai ...................... F16B 2/22 248/229.16
12,356,563 B2 * 7/2025 Kato .................... H05K 5/0204

* cited by examiner

*Primary Examiner* — Angel R Estrada

(57) ABSTRACT

An enclosure for retaining at least one networking component includes a shell defining an interior volume and including an upper retention member forming a channel and a retention bracket that is at least partially disposable within the interior volume of the shell. The retention bracket includes a base panel having an upper hook member adapted to engage the upper retention member of the shell to slidably couple the retention bracket with the shell, and a retaining panel extending distally from the base panel. The retaining panel includes a lower platform and a distal platform. The base panel, the lower platform of the retaining panel, and the distal platform of the retaining panel cooperate to receive and retain the at least one networking component.

20 Claims, 11 Drawing Sheets

LOCKING APPARATUS FOR OUTDOOR NETWORK TERMINAL

FIELD OF THE DISCLOSURE

This disclosure relates generally to networking systems, and, more particularly, to locking apparatuses for networking components.

BACKGROUND

A conventional passive optical network (PON) includes one or more optical line terminals (OLTs) at a central location connecting to one or more optical last mile termination units (LMTUs) disposed at respective customer premises (e.g., physical locations serviced by the PON) via one or more optical fibers. A PON is typically implemented using a point-to-multipoint topology in which a feeder optical fiber from an OLT serves multiple last mile termination units. In some examples, an LMTU may be in the form of an optical network terminal (ONT) or an optical network unit (ONU) that is optically connected to the OLT via a respective distribution optical fiber received at the LMTU. Such ONTs are typically disposed within enclosures that may be affixed to a structure, a pole, and/or other suitable stationary objects.

Because of continued advancements to PON technologies, better and/or higher-powered ONTs have been developed which may be dimensionally larger than existing units. Such ONTs may require replacement retention mechanisms (e.g., brackets, straps, etc.) in order to securely retain the ONT within the enclosure. Such mechanisms may require on-site modifications and/or alterations to the existing enclosure (e.g., by removing portions of the enclosure or other retention features), and ultimately may not provide for securely retaining the ONT. Further, such modifications may be time-consuming and may lead to improper installations. Further still, such modifications to the existing enclosure may result in the enclosure no longer being capable of securely retaining other ONT models due to the removal of necessary retention features and/or material.

Accordingly, there is a need for improved devices having improved functionalities.

SUMMARY

In accordance with a first aspect, an enclosure for retaining at least one networking component includes a shell defining an interior volume and including an upper retention member forming a channel and a retention bracket that is at least partially disposable within the interior volume of the shell. The retention bracket includes a base panel having an upper hook member adapted to engage the upper retention member of the shell to slidably couple the retention bracket with the shell, and a retaining panel extending distally from the base panel. The retaining panel includes a lower platform and a distal platform. The base panel, the lower platform of the retaining panel, and the distal platform of the retaining panel cooperate to receive and retain the at least one networking component.

In some examples, the shell may additionally include a lower retention member that forms a channel. The base panel of the retention bracket may additionally include a lower hook member that engages the lower retention member to slidably couple the retention bracket with the shell.

In some approaches, the upper hook member of the base panel includes a stop member to limit lateral movement of the retention bracket relative to the upper retention member. Further, in examples, the lower platform may include a passthrough opening to accommodate at least one transmission cable.

In some forms, the enclosure may further include at least one ventilation opening formed on the base panel and/or the retaining panel. Further, in some examples, the base panel of the retention bracket may further include a chamfered surface to slidably engage a corresponding chamfered surface of the upper retention member.

The base panel of the retention bracket may additionally include a grooved region that receives a securing fastener. In some of these examples, the securing fastener may be a hook and loop member that releasably retains the at least one networking component.

In some examples, the retaining panel may be adjustable to receive at least one networking component having different dimensions than the at least one networking component.

In accordance with a second aspect, a retention bracket adapted to retain an optical network terminal is provided that includes a base panel and a retaining panel. The base panel has an upper hook member adapted to engage a portion of a shell of a housing to slidably couple the retention bracket with the shell. The retaining panel extends distally from the base panel and includes a lower platform and a distal platform. The base panel, the lower platform of the retaining panel, and the distal platform of the retaining panel cooperate to receive and retain the at least one networking component.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate examples of concepts that include the claimed invention, and explain various principles and advantages of those examples.

Figure 1:
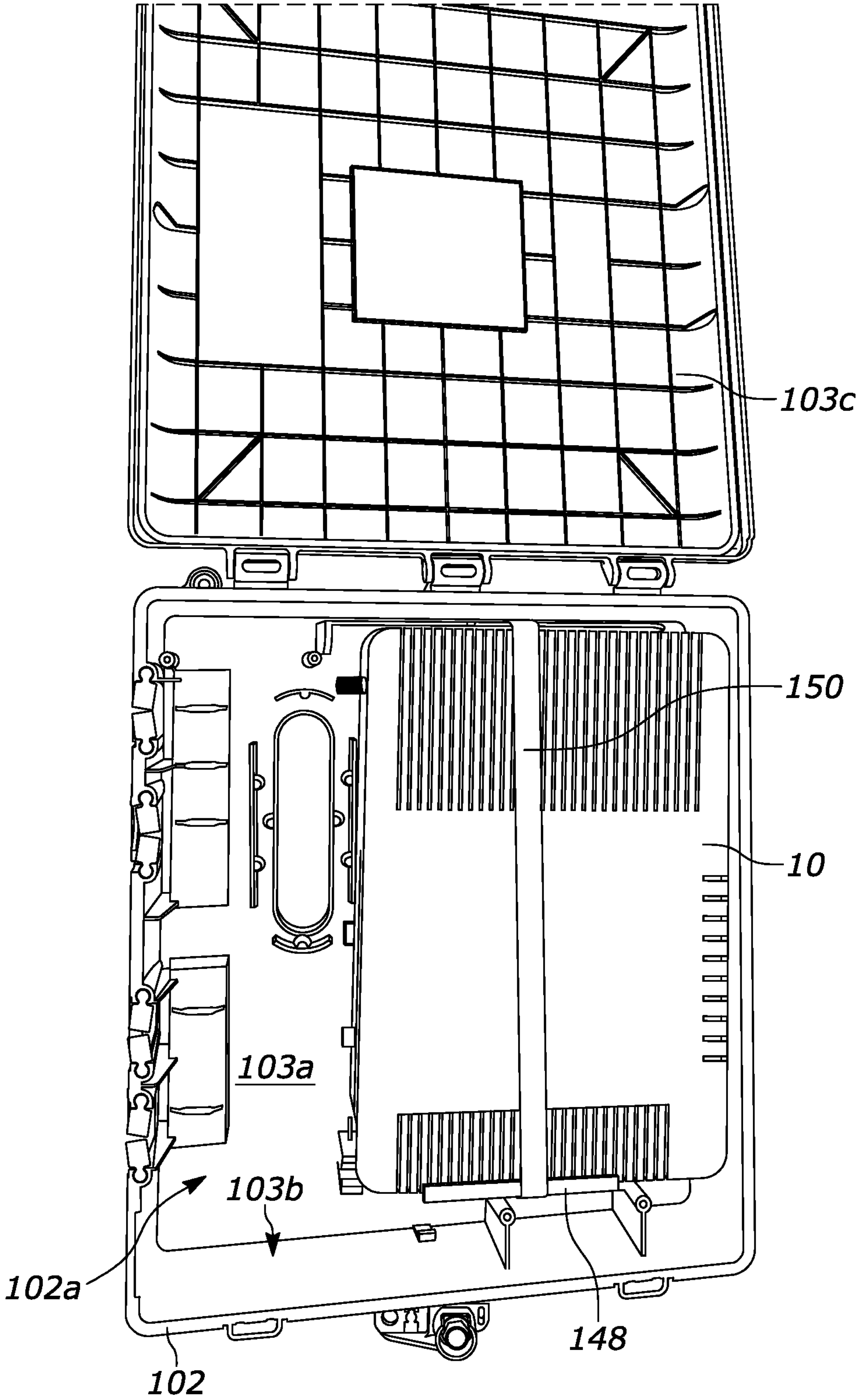
FIG. 1 is a perspective view of an example enclosure for retaining at least one networking component in which the systems, methods, and/or techniques of the present disclosure may be implemented.
Figure 2:
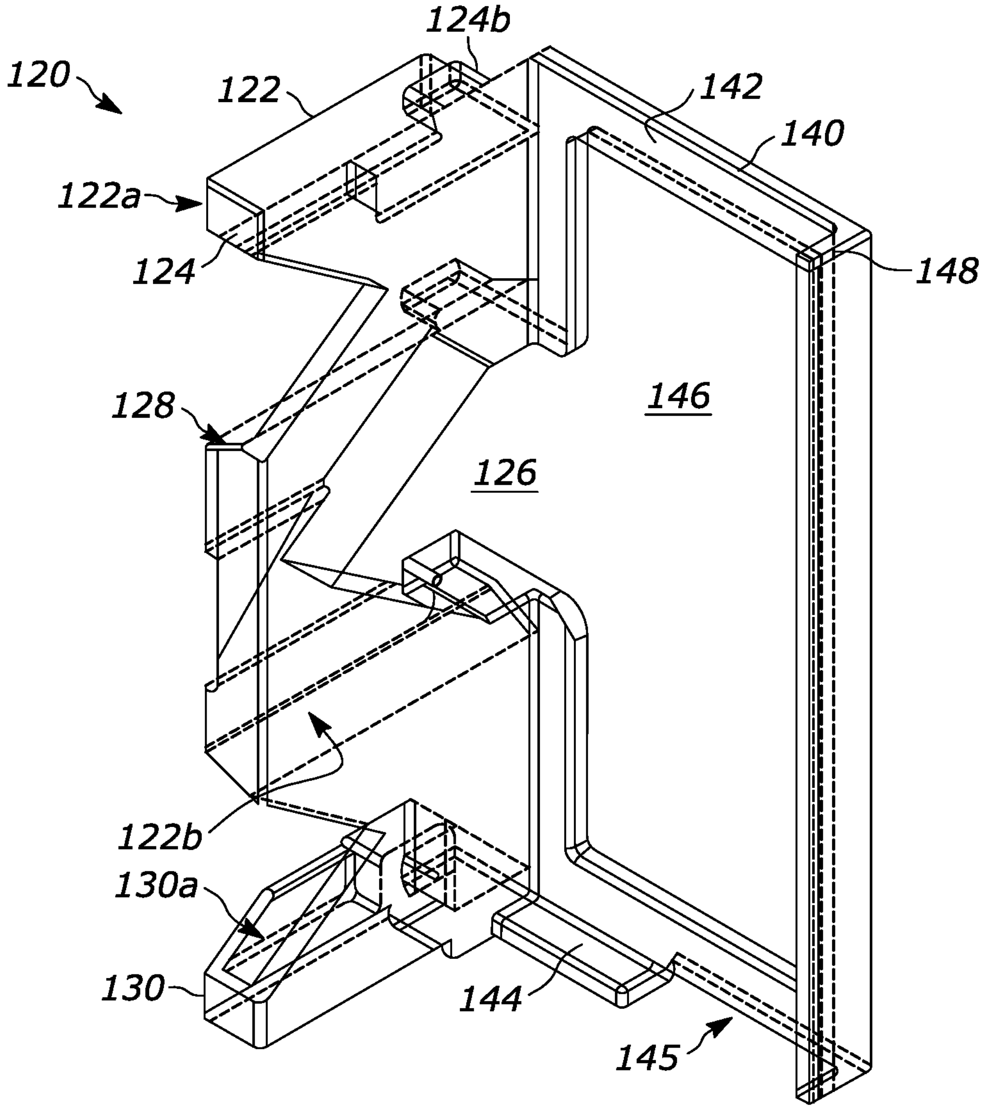
FIG. 2 is a perspective view of an example retention bracket for use with the enclosure of FIG. 1 in accordance with various examples.
Figure 3:
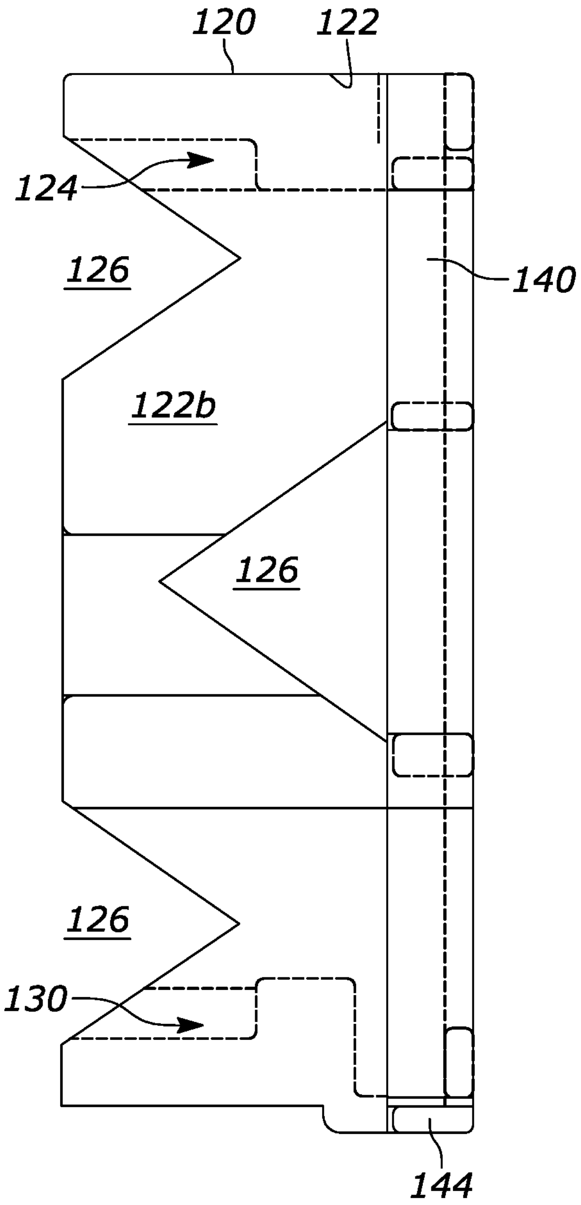
FIG. 3 is a front elevation view of the example retention bracket of FIG. 2 in accordance with various examples.
Figure 4:
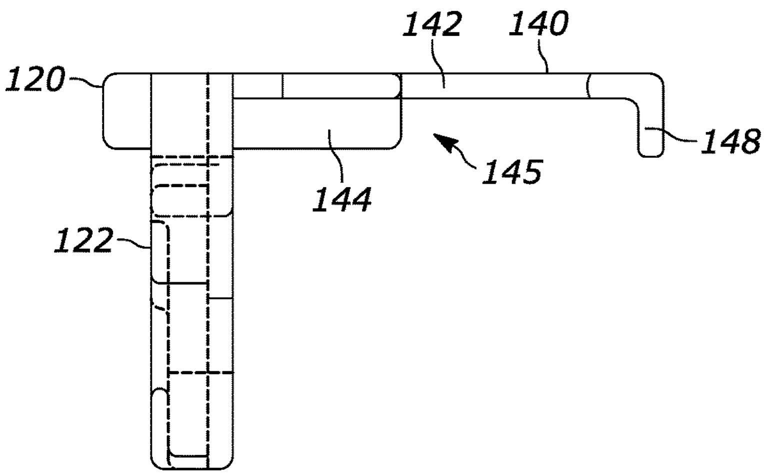
FIG. 4 is a top plan view of the example retention bracket of FIGS. 2 and 3 in accordance with various examples.
Figure 5:
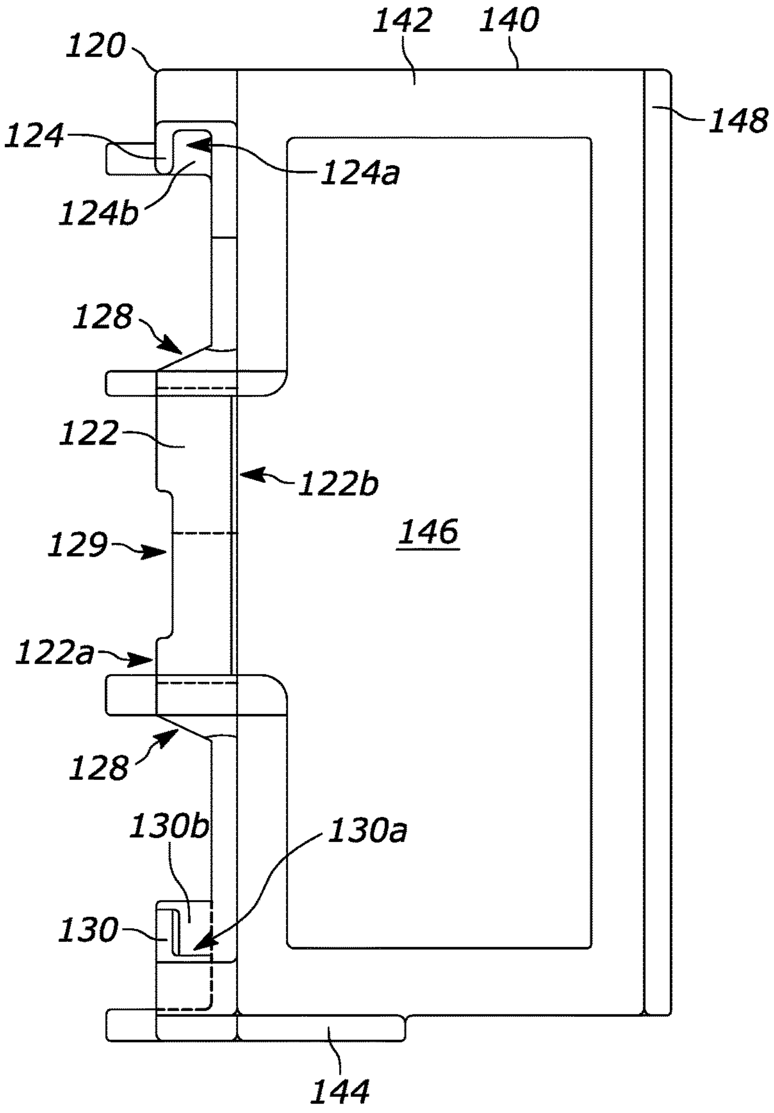
FIG. 5 is a left side elevation view of the example retention bracket of FIGS. 2-4 in accordance with various examples.
Figure 6:
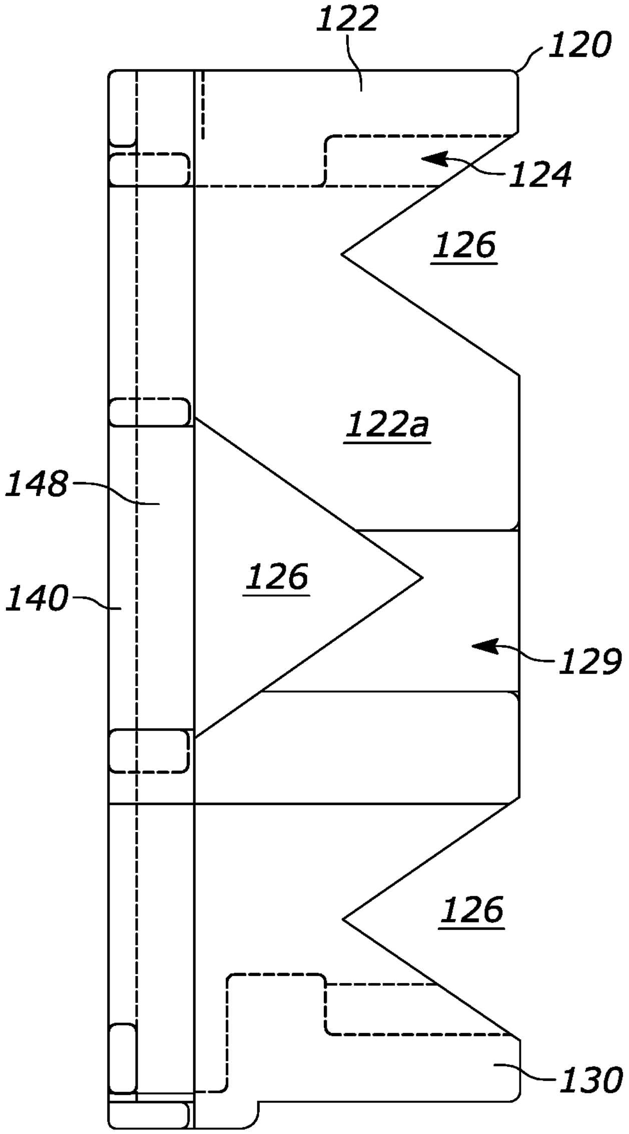
FIG. 6 is a back side elevation view of the example retention bracket of FIGS. 2-5 in accordance with various examples.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various examples. Also, common but well-understood elements that are useful or necessary in a commercially feasible examples are often not depicted in order to facilitate a less obstructed view of these various examples. It will further be appreciated that certain actions and/or steps may be described or depicted in a particular order of occurrence while those skilled in the art will understand that such specificity with respect to sequence is not actually required. It will also be understood that the terms and expressions used herein have the ordinary technical meaning as is accorded to such terms and expressions by persons skilled in the technical field as set forth above except where different specific meanings have otherwise been set forth herein.

The apparatus and method components have been represented where appropriate by conventional symbols in the drawings, showing only those specific details that are pertinent to understanding examples of the present disclosure so as not to obscure the disclosure with details that will be readily apparent to those of ordinary skill in the art having the benefit of the description herein.

Although the figures show parts with clean lines and boundaries, some or all of these lines and/or boundaries may be idealized. In reality, the boundaries and/or lines may be unobservable, blended, and/or irregular. Use of terms such as up, down, top, bottom, side, end, front, back, etc. herein are used with reference to a currently considered or illustrated orientation. If they are considered with respect to another orientation, it should be understood that such terms must be correspondingly modified.

DETAILED DESCRIPTION

Disclosed examples of the disclosure provide a number of advantages over existing techniques for securing and retaining components of passive optical networks (PONs). Generally speaking, a component of a PON, as utilized herein, may be in the form of a last mile termination unit (e.g., an optical network terminal (ONT) or an optical network unit (ONU) disposed at customer premises). Such a component may be securely retained within an existing enclosure using a bracket or locking apparatus. The brackets described herein may accommodate dimensionally larger networking components without the need for modifications to the enclosure and/or the networking component to achieve a secure fit. Further, in some examples, the brackets described herein may eliminate the need for additional securing mechanisms. Last, in some examples, the brackets described herein may be adjustable in nature to securely accommodate and retain various networking components having different sizes and/or shapes.

Turning now to the Figures, an enclosure 100 is provided for retaining at least one networking component 10 (e.g., an ONT, ONU, and/or any other device). The enclosure 100 may include a shell 102 defining an interior volume 102*a* and a retention bracket 120. More specifically, the illustrated shell 102 of the enclosure 100 includes a rear panel 103*a*, a number of sidewalls 103*b*, and a door 103*c*. While the illustrated enclosure 100 is in the form of a generally rectangular box, it is to be appreciated that the enclosure 100 may take any number of suitable shapes, forms, and/or configurations.

An upper retention member 104 is coupled with (i.e., attached therewith) or otherwise formed on the rear panel 103*a* of the shell 102. More specifically, the upper retention member 104 is in the form of a ledge extending along a length of the rear panel 103*a*. The upper retention member 104 and the back panel 103*a* cooperate to form a channel 104*a*. In the illustrated example, the upper retention member 104 has an open upper portion, while the lower portion thereof is operably coupled with the rear panel 103*a* of the shell 102. However, it is to be appreciated that in other examples (not illustrated), an opposite configuration may be provided.

In some examples, a lower retention member 110 is also coupled with (i.e., attached therewith) or otherwise formed on the rear panel 103*a* of the shell 102. The lower retention member 110 may also be in the form of a ledge extending along a length of the rear panel 103*a*. The lower retention member 110 and the back panel 103*a* cooperate to form a channel 110*a*. In the illustrated example, the lower retention member 110 has an open lower portion, while the upper portion thereof is operably coupled with the rear panel 103*a* of the shell 102. However, it is to be appreciated that in other examples (not illustrated), an opposite configuration may be provided.

It is to be appreciated that in some examples, the upper retention member 104 (and, in examples where a lower retention member 110 is provided) may be coupled with or otherwise formed on any one of the sidewalls 103*b* and/or the door 103*c*.

The retention bracket 120 may be at least partially disposed and/or otherwise positionable within the interior volume 102*a* of the shell 102. The retention bracket 120 includes a base panel 122 and a retaining panel 140 operably coupled together. In some examples, the retention bracket 120 is in the form of a unitary component, and in other examples, the base panel 122 and the retaining panel 140 are operably coupled together via any number of suitable approaches such as, for example, fasteners, adhesives, ultrasonic welding, and the like. The retention bracket 120 may be constructed from any number of suitable materials such as, for example, polymeric materials, metals, and the like. Other examples are possible.

Generally speaking, the base panel 122 is adapted to slidably couple with the shell 102. The base panel 122 includes an upper hook member 124 extending and/or protruding away from a rear surface 122*a* of the base panel 122 and extending along a length thereof. In some examples, the upper hook member 124 may be integrally formed with the base panel 122. In yet other examples, the upper hook member 124 may be operably coupled with the base panel 122 via any number of suitable approaches. The upper hook member 124 and the base panel 122 cooperate to form an upper hook channel 124*a*. In the illustrated example, the upper hook member 124 has an open lower portion, while the upper portion thereof is operably coupled with the base panel 122 of the retention bracket 120. However, it is to be appreciated that in other examples (not illustrated), an opposite configuration may be provided.

In some examples, the base panel 122 may also include a lower hook member 130 extending and/or protruding away from the rear surface 122*a* of the base panel 122 and extending along a length thereof. In some examples, the lower hook member 130 may be integrally formed with the base panel 122. In yet other examples, the lower hook member 130 may be operably coupled with the base panel 122 via any number of suitable approaches. The lower hook member 130 and the base panel 122 cooperate to form a lower hook channel 130*a*. In the illustrated example, the lower hook member 130 has an open upper portion, while the lower portion thereof is operably coupled with the base panel 122 of the retention bracket 120. However, it is to be appreciated that in other examples (not illustrated), an opposite configuration may be provided.

The retaining panel 140 extends distally from the base panel 122 and includes a retaining panel body 142, a lower platform 144 extending from the retaining panel body 142, and a distal platform 148 also extending from the retaining panel body 142. In some examples, each of a front surface 122*b* of the base panel 122, the retaining panel body 142, the lower platform 144, and the distal platform 148 are generally planar in shape. More specifically, the lower platform 144, which extends outwardly from the retaining panel body 142, is provided as a ledge to retain a portion (e.g., a lower portion) of the networking component 10.

Figure 7:
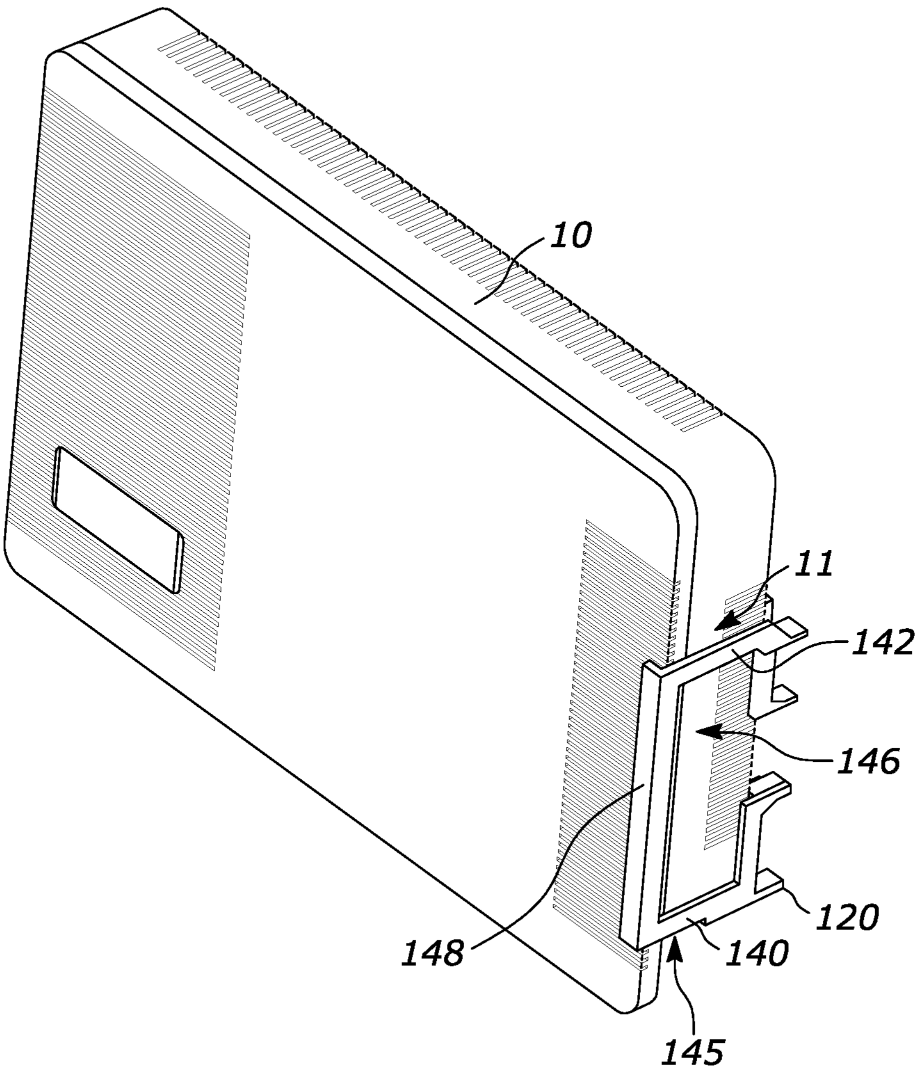
FIG. 7 is a front perspective view of the example retention bracket of FIGS. 2-6 while retaining an example networking component in accordance with various examples.
Figure 8:
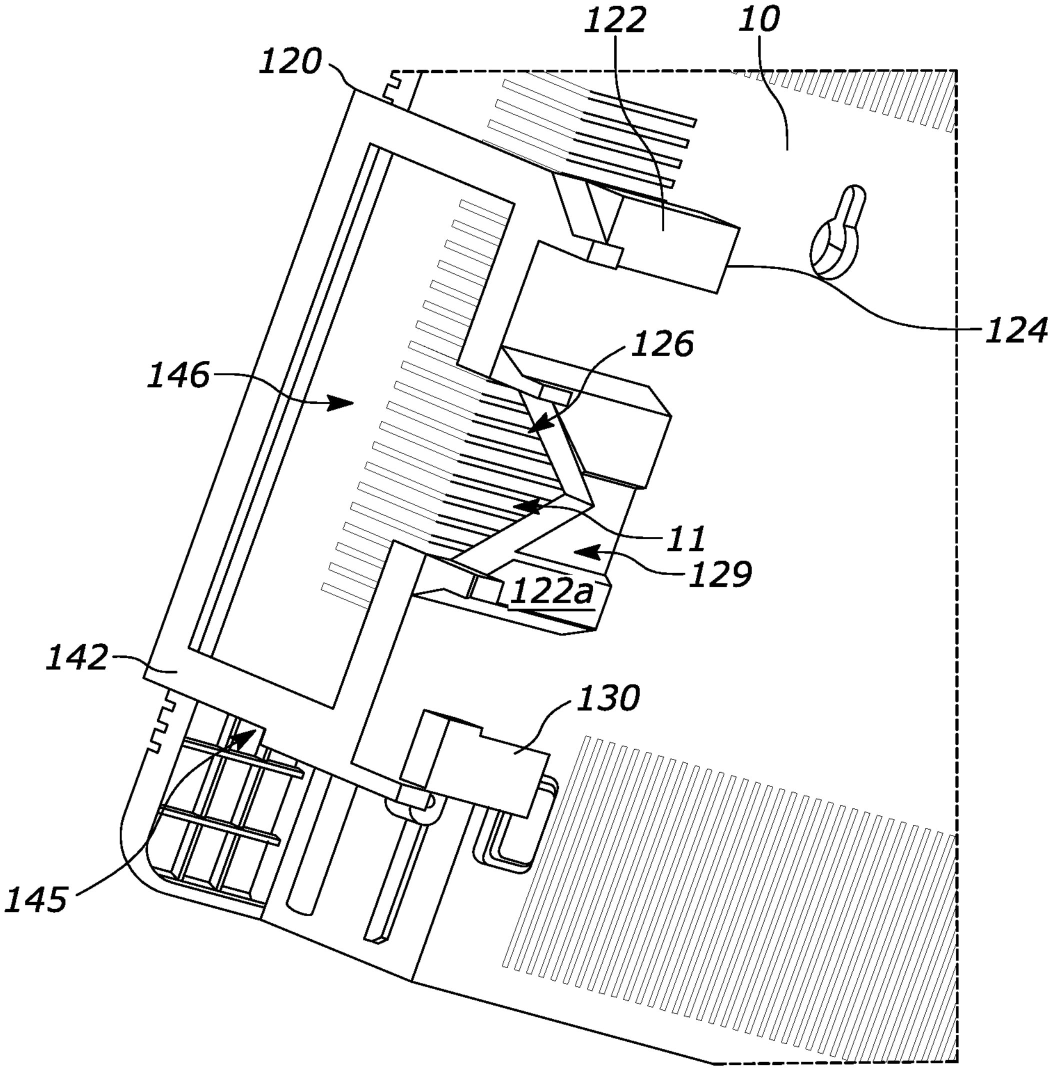
FIG. 8 is a rear perspective view of the example retention bracket of FIGS. 2-6 while retaining an example networking component in accordance with various examples.
Figure 9:
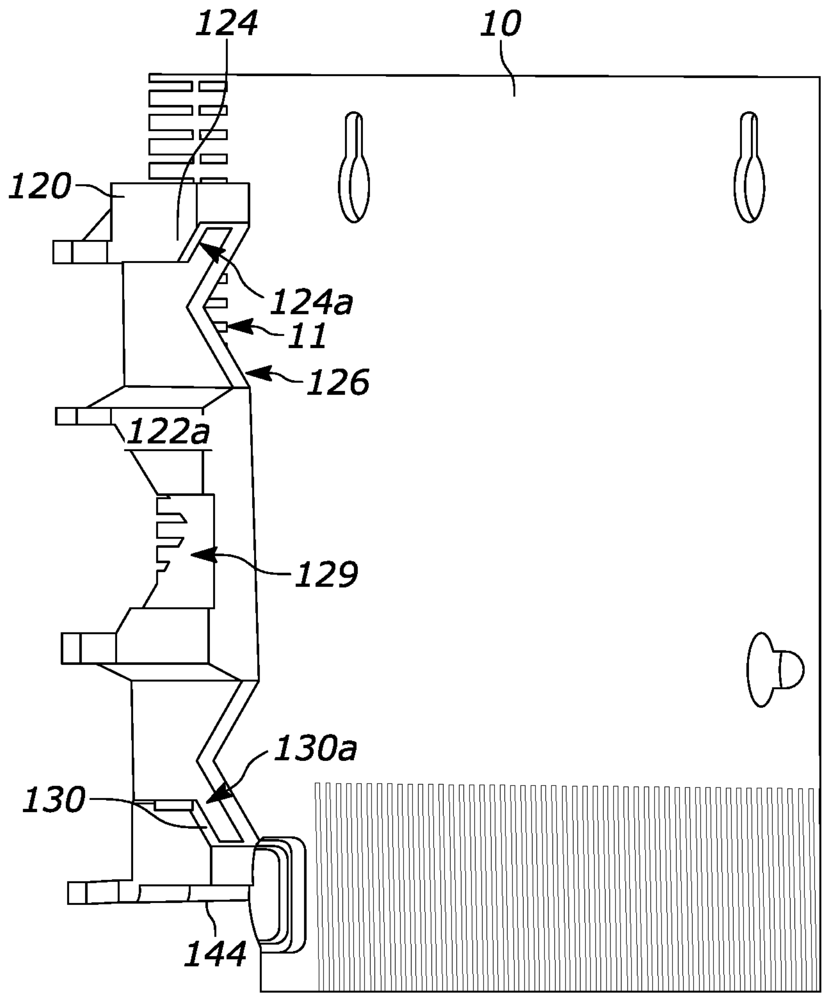
FIG. 9 is a rear perspective view of the example retention bracket of FIGS. 2-6 while retaining an example networking component in accordance with various examples.
Figure 10:
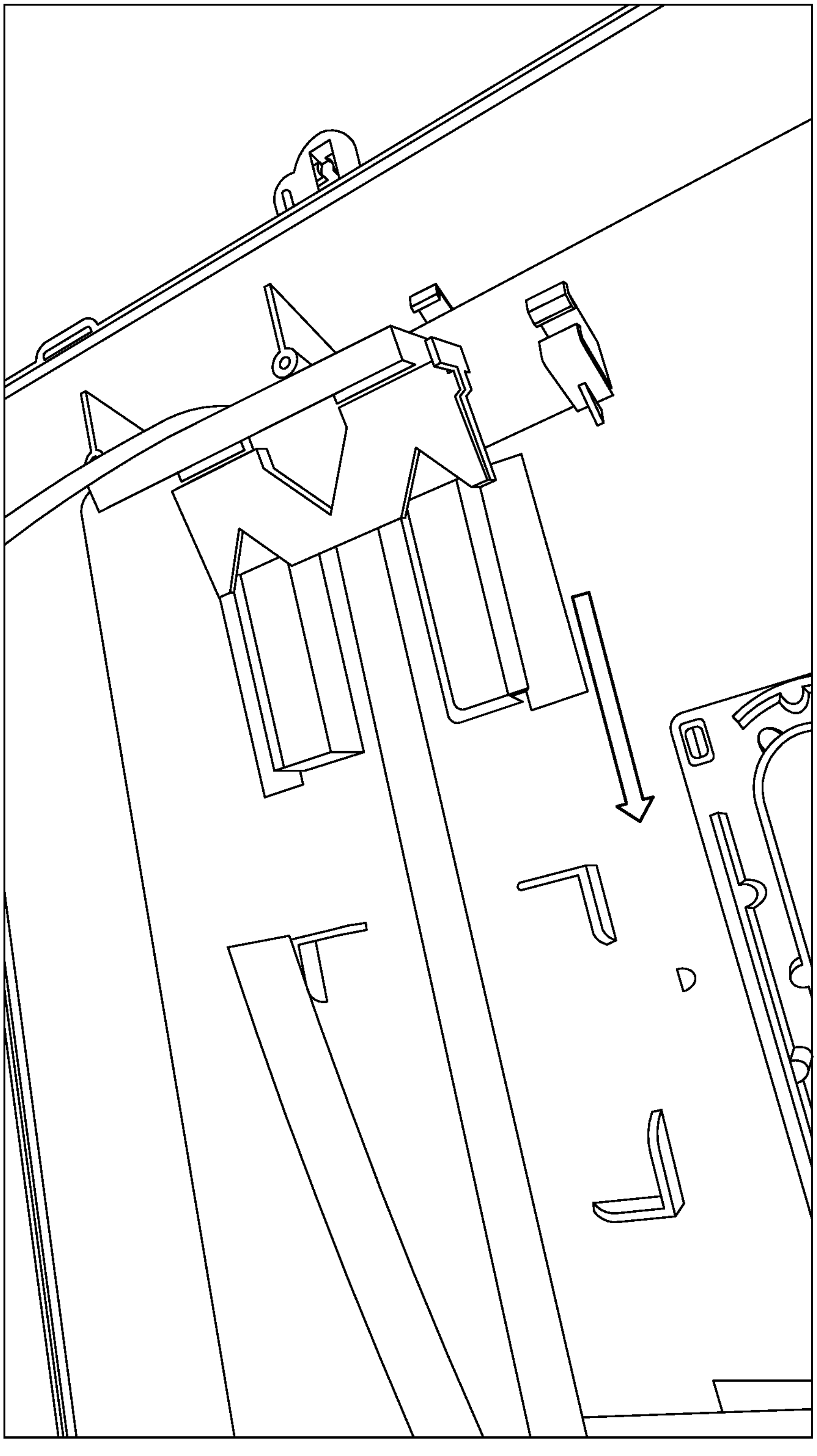
FIG. 10 is a perspective view of the example retention bracket of FIGS. 2-6 operably coupled with the enclosure of FIG. 1 in accordance with various examples.
Figure 11:
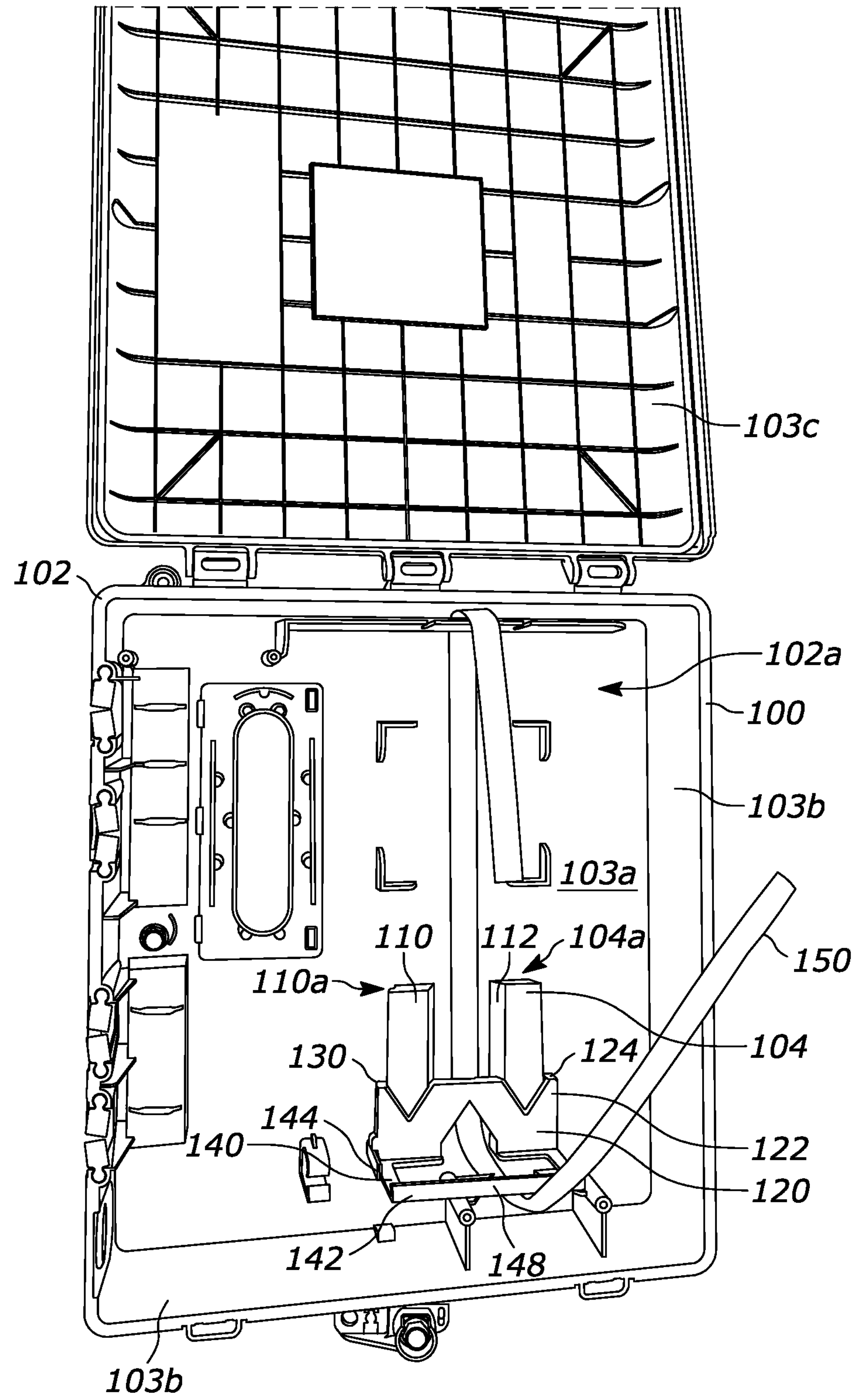
FIG. 11 is a perspective view of the example enclosure of FIGS. 1-10 having the example bracket operably coupled therewith in accordance with various examples.
Figure 12:
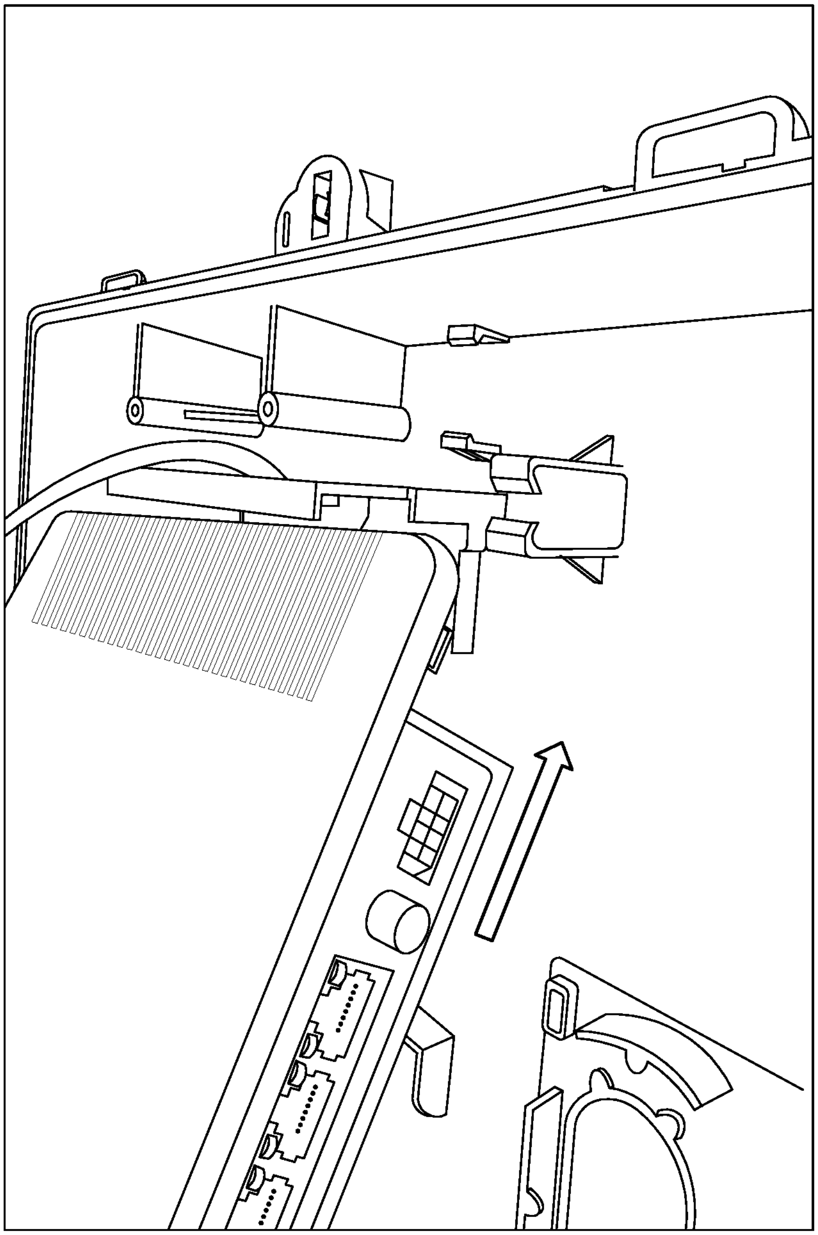
FIG. 12 is a perspective view of the example enclosure of FIGS. 1-11 having an example networking component being operably coupled therewith in accordance with various examples.

The distal platform 148 also extends outwardly from the retaining panel body 142 and is provided to engage an outer portion of the networking component 10. The base panel 122, the retaining panel body 142, the lower platform 144, and the distal platform 148 cooperate to receive and retain the networking component 10. As illustrated in FIGS. 7-9, a portion of the networking component 10 may be inserted into an opening defined by the base panel 122, the retaining panel body 142, the lower platform 144, and the distal platform 148, whereupon the front surface 122*b* of the base panel abuts a portion (e.g., a rear surface) of the networking component 10, the retaining panel body 142 abuts a different portion (e.g., a side surface) of the networking component 10, the lower platform 144 abuts a different portion (e.g., a lower or cutout ledge portion) of the networking component 10, and the distal platform 148 abuts still a different portion (e.g., a front surface) of the networking component 10. The distance between the front surface 122*b* of the base panel 122 and the distal platform 148 of the retaining panel 140 may be provided so as to closely match a corresponding dimension (e.g., a depth dimension) of the networking component 10 such that the distal platform 148 frictionally engages the networking component 10 to prevent distal movement.

Further, the lower platform 144 is provided and dimensioned to support and constrain the networking component 10 in the generally vertical direction and serve as a "euro brace" in conjunction with the base panel 122 and the retaining panel body 142. In the illustrated example, the networking component 10 includes a cut-out portion that interrupts the generally rectangular prismatic arrangement thereof. Such an arrangement may be provided to accommodate a concealed power and/or data transmission port. When coupled with the networking component 10, the networking component 10 rests on the lower platform 144 at a ledge formed by the cut-out portion. It is to be appreciated that in some examples, the lower platform 144 may instead support a bottom surface of the networking component 10. In any of these arrangements, the lower platform 144 provides an additional point of stability to secure the networking component 10.

Prior to or after disposing the networking component 10 within the retention bracket 120, the retention bracket 120 may be coupled with the shell 102. More specifically, in some examples, the channel 104*a* formed by the rear panel 103*a* and the upper retention member 104 may be dimensioned to receive the upper hook member 124. Further, the upper hook channel 124*a* formed by the upper hook member 124 and the rear surface 122*a* of the base panel 122 may be dimensioned to receive the upper retention member 104. So arranged, the upper retention member 104 may mate or otherwise nest with the upper hook member 124.

Similarly, in examples where the lower retention member 110 and the lower hook member 130 are provided, the channel 110*a* formed by the rear panel 103*a* and the lower retention member 110 may be dimensioned to receive the lower hook member 130. Further, the lower hook channel 130*a* formed by the lower hook member 130 and the rear surface 122*a* of the base panel 122 may be dimensioned to receive the lower retention member 110. So arranged, the lower retention member 110 may also mate or otherwise nest with the lower hook member 130.

The retention bracket 120 (along with the networking component 10, if previously coupled therewith) may be coupled with the shell 102 of the enclosure 100 using a number of approaches. In a first example, the retention bracket 120 may be positioned so that the upper hook member 124 is disposed above the upper retention member 104. The retention bracket 120 may then be lowered such that the upper hook member 124 mates with the upper retention member 104, thereby allowing the upper hook member 124 to be slidably disposed within the channel 104*a*. It is to be appreciated that in examples where the lower hook member 130 and the lower retention member 110 are provided, In a second example, the retention bracket 120 may be positioned to the side of the upper retention member 104 (and the lower retention member 110, if provided). The upper hook member 124 of the retention bracket 120 may then slidably engage the upper retention member 104 (and the lower hook member 130 may similarly slidably engage the lower retention member 110, if provided) by moving the retention bracket 120 in a generally horizontal or lateral direction relative to the shell 102 such that the upper hook member 124 is disposed within the channel 104*a* and the upper retention member 104 is disposed within the upper hook channel 124*a*.

In some approaches, the upper hook member 124 may include a stop member 124*b* that prevents or otherwise limits lateral movement of the retention bracket 120 past a certain point with respect to the upper retention member 104. As such, the stop member 124*b* may prevent the retention bracket 120 (and thus, the networking component 10 coupled therewith) from decoupling from the shell 102. As before, in examples where the lower hook member 130 is provided, a stop 130*b* may also be included thereon to additionally prevent or otherwise limit lateral movement of the retention bracket 120.

The enclosure 100 may include any number of additional features to assist with securing the networking component 10 therein. For example, the base panel 122 of the retention bracket 120 may include any number of chamfered or otherwise angled surfaces 128 that may slidably engage a corresponding chamfered or otherwise angled surface carried by the upper retention member 104 and/or the rear panel

103*a* of the shell 102. Such a configuration may provide for better alignment and positioning of the retention bracket 120 relative to the shell 102.

Further, in some examples, the base panel 122 and/or the retaining panel 140 may include any number of ventilation openings 126, 146, respectively. These ventilation openings 126, 146 may be positioned and dimensioned to be disposed adjacent to corresponding ventilation openings 11 of the networking component 10 to provide for increased airflow to the networking component 10. In the illustrated example, the ventilation opening 146 of the retaining panel 140 occupies a significant portion of an overall area of the retaining panel body 142 such that the retaining panel body 142 is generally in the form of an outer frame. However, in other examples (not illustrated) the retaining panel body 142 may include additional material and have a smaller ventilation opening or openings 146 relative to its overall size.

Additionally, in these and other examples, the retaining panel 140 may include a passthrough opening 145 to provide clearance for a data and/or power transmission cable to be coupled with the corresponding power and/or data transmission port of the networking component 10.

In yet other examples (not illustrated), the retaining panel body 142 of the retention bracket 120 may be adjustable to accommodate networking components 10 of varying sizes (e.g., networking components having varying thicknesses). More specifically, the retaining panel body 142 may be in the form of a telescoping member that may selectively extend or retract relative to the base panel 122. So arranged, the distal platform 148 may be extended or retracted to retain differently dimensioned networking components.

The retention bracket 120 may additionally include an optional grooved region 129 on the base panel 122. This grooved region 129 may allow a securing fastener (e.g., a hook and loop member 150) to be positioned thereon to further secure the networking component 10 with the retention bracket 120. As an example, the securing fastener may wrap around a periphery of the networking component 10 and the retention bracket 120 to further prevent the networking component 10 from becoming decoupled with the retention bracket 120.

So arranged, the enclosure 100 and the retention bracket 120 thereof may be used to safely retain larger networking components. As such, the retention bracket 120 may be used with existing shells 102 without needing to make modifications to the shell 102 or the networking device 10. Put differently, the retention bracket 120 may be provided as a retrofittable component. In some examples, the retention bracket 120 may be relatively thicker (e.g., between approximately 10 mm and approximately 50 mm) than previously incorporated brackets, thereby increasing a space between the rear panel 103*a* and the networking component 10 to provide for increased airflow and ventilation.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings. Numerous alternative examples could be implemented, using either current technology or technology developed after the filing date of this patent, which would still fall within the scope of the claims. Additionally, the described embodiments/examples/implementations should not be interpreted as mutually exclusive and should instead be understood as potentially combinable if such combinations are permissive in any way. In other words, any feature disclosed in any of the aforementioned embodiments/examples/implementations may be included in any of the other aforementioned embodiments/examples/implementations.

The benefits, advantages, solutions to problems, and any element(s) that may cause any benefit, advantage, or solution to occur or become more pronounced are not to be construed as a critical, required, or essential features or elements of any or all the claims. The claimed invention is defined solely by the appended claims including any amendments made during the pendency of this application and all equivalents of those claims as issued.

Moreover, in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting example the term is defined to be within 10%, in another example within 5%, in another example within 1% and in another example within 0.5%. The term "coupled" as used herein is defined as connected, although not necessarily directly and not necessarily mechanically. A device or structure that is "configured" in a certain way is configured in at least that way, but may also be configured in ways that are not listed.

Further, unless expressly stated to the contrary, "or" refers to an inclusive or and not to an exclusive or. For example, "A, B or C" refers to any combination or subset of A, B, C such as (1) A alone, (2) B alone, (3) C alone, (4) A with B, (5) A with C, (6) B with C, and (7) A with B and with C. As used herein, the phrase "at least one of A and B" is intended to refer to any combination or subset of A and B such as (1) at least one A, (2) at least one B, and (3) at least one A and at least one B. Similarly, the phrase "at least one of A or B" is intended to refer to any combination or subset of A and B such as (1) at least one A, (2) at least one B, and (3) at least one A and at least one B.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various examples for the purpose of streamlining the disclosure. This method of disclosure is not to be interpreted as reflecting an intention that the claimed examples require more features than are expressly recited in each claim. Rather, as the following claims reflect, inventive subject matter may lie in less than all features of a single disclosed example. Thus, the following claims are hereby incorporated into the Detailed Description, with each claim standing on its own as a separately claimed subject matter.

By way of example, and not limitation, the disclosure herein contemplates at least the following examples:

1. An enclosure for retaining at least one networking component, the enclosure comprising a shell defining an interior volume, the shell including an upper retention member forming a channel, a retention bracket adapted to be at least partially disposed within the interior volume of the shell, the retention bracket including a base panel having an upper hook member adapted to engage the upper retention member of the shell to slidably couple the retention bracket with the shell, and a retaining panel extending distally from the base panel, the retaining panel including a lower platform and a distal platform, wherein the base panel, the lower platform of the retaining panel, and the distal platform of the retaining panel cooperate to receive and retain the at least one networking component.
2. The enclosure of example 1, wherein the shell further comprises a lower retention member forming a channel, the base panel of the retention bracket further including a lower hook member adapted to engage the lower retention member of the shell to slidably couple the retention bracket with the shell.
3. The enclosure of any one of the preceding examples, wherein the upper hook member of the base panel includes a stop member to limit lateral movement of the retention bracket relative to the upper retention member.
4. The enclosure of any one of the preceding examples, wherein the lower platform includes a passthrough opening to accommodate at least one transmission cable.
5. The enclosure of any one of the preceding examples, further comprising at least one ventilation opening formed on the base panel.
6. The enclosure of any one of the preceding examples, further comprising at least one ventilation opening formed on the retaining panel.
7. The enclosure of any one of the preceding examples, wherein the base panel of the retention bracket further includes a chamfered surface to slidably engage a corresponding chamfered surface of the upper retention member.
8. The enclosure of any one of the preceding examples, wherein the base panel of the retention bracket further includes a grooved region adapted to receive a securing fastener.
9. The enclosure of example 9, wherein the securing fastener comprises a hook and loop member adapted to releasably retain the at least one networking component.
10. The enclosure of any one of the preceding examples, wherein the retaining panel is adjustable to receive at least one networking component having different dimensions than the at least one networking component.
11. A retention bracket adapted to retain an optical network terminal, the retention bracket including a base panel having an upper hook member adapted to engage a portion of a shell of a housing to slidably couple the retention bracket with the shell, and a retaining panel extending distally from the base panel, the retaining panel including a lower platform and a distal platform, wherein the base panel, the lower platform of the retaining panel, and the distal platform of the retaining panel cooperate to receive and retain the at least one networking component.
12. The retention bracket of example 11, further including a lower hook member formed on the base panel, the lower hook member adapted to engage a portion of the shell of the housing to slidably couple the retention bracket therewith.
13. The retention bracket of any one of examples 11-12, wherein the upper hook member of the base panel includes a stop member to limit lateral movement.
14. The retention bracket of any one of examples 11-13, wherein the lower platform of the retaining panel includes a passthrough opening to accommodate at least one transmission cable.
15. The retention bracket of any one of examples 11-14, further comprising at least one ventilation opening formed on the base panel.
16. The retention bracket of any one of examples 11-15, further comprising at least one ventilation opening formed on the retaining panel.
17. The retention bracket of any one of examples 11-16, wherein the base panel further includes a chamfered surface for sliding engagement with the shell.
18. The retention bracket of any one of examples 11-17, wherein the base panel further includes a grooved region adapted to receive a securing fastener.
19. The retention bracket of example 18, wherein the securing fastener comprises a hook and loop member adapted to releasably retain the at least one networking component.
20. The retention bracket of any one of examples 11-19, wherein the retaining panel is adjustable to receive at least one networking component having different dimensions than the at least one networking component.

Finally, any references, including, but not limited to, publications, patent applications, and patents cited herein are hereby incorporated in their entirety by reference to the same extent as if each reference were individually and specifically indicated to be incorporated by reference and were set forth in its entirety herein.

The patent claims at the end of this patent application are not intended to be construed under 35 U.S.C. § 112(f) unless traditional means-plus-function language is expressly recited, such as "means for" or "step for" language being explicitly recited in the claim(s). The systems and methods described herein are directed to an improvement to computer functionality, and improve the functioning of conventional computers.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An enclosure for retaining at least one networking component, the enclosure comprising:

a shell defining an interior volume, the shell including an upper retention member forming a channel;

a retention bracket adapted to be at least partially disposed within the interior volume of the shell, the retention bracket including:

a base panel having an upper hook member adapted to engage the upper retention member of the shell to slidably couple the retention bracket with the shell, and a retaining panel extending distally from the base panel, the retaining panel including a retaining panel body extending distally from the base panel, a lower platform extending outwardly from the retaining panel body, and a distal platform extending outwardly from the retaining panel body, wherein the distal platform is adapted to frictionally engage a front surface of the at least one networking component to prevent distal movement, wherein the base panel, the lower platform of the retaining panel, and the distal platform of the retaining panel cooperate to receive and retain the at least one networking component.

2. The enclosure of claim 1, wherein the shell further comprises a lower retention member forming a channel, the base panel of the retention bracket further including a lower hook member adapted to engage the lower retention member of the shell to slidably couple the retention bracket with the shell.

3. The enclosure of claim 1, wherein the upper hook member of the base panel includes a stop member to limit lateral movement of the retention bracket relative to the upper retention member.

4. The enclosure of claim 1, wherein the lower platform includes a passthrough opening to accommodate at least one transmission cable.

5. The enclosure of claim 1, further comprising at least one ventilation opening formed on the base panel.

6. The enclosure of claim 1, further comprising at least one ventilation opening formed on the retaining panel.

7. The enclosure of claim 1, wherein the base panel of the retention bracket further includes a chamfered surface to slidably engage a corresponding chamfered surface of the upper retention member.

8. The enclosure of claim 1, wherein the base panel of the retention bracket further includes a grooved region adapted to receive a securing fastener.

9. The enclosure of claim 8, wherein the securing fastener comprises a hook and loop member adapted to releasably retain the at least one networking component.

10. The enclosure of claim 1, wherein the retaining panel is adjustable to receive at least one networking component having different dimensions than the at least one networking component.

11. A retention bracket adapted to retain an optical network terminal, the retention bracket including:

a base panel having an upper hook member adapted to engage a portion of a shell of a housing to slidably couple the retention bracket with the shell, and a retaining panel extending distally from the base panel, the retaining panel including a retaining panel body extending distally from the base panel, a lower platform extending outwardly from the retaining panel body, and a distal platform extending outwardly from the retaining panel body, wherein the distal platform frictionally engages a front surface of the at least one networking component to prevent distal movement, wherein the base panel, the lower platform of the retaining panel, and the distal platform of the retaining panel cooperate to receive and retain the at least one networking component.

12. The retention bracket of claim 11, further including a lower hook member formed on the base panel, the lower hook member adapted to engage a portion of the shell of the housing to slidably couple the retention bracket therewith.

13. The retention bracket of claim 11, wherein the upper hook member of the base panel includes a stop member to limit lateral movement.

14. The retention bracket of claim 11, wherein the lower platform of the retaining panel includes a passthrough opening to accommodate at least one transmission cable.

15. The retention bracket of claim 11, further comprising at least one ventilation opening formed on the base panel.

16. The retention bracket of claim 11, further comprising at least one ventilation opening formed on the retaining panel.

17. The retention bracket of claim 11, wherein the base panel further includes a chamfered surface for sliding engagement with the shell.

18. The retention bracket of claim 11, wherein the base panel further includes a grooved region adapted to receive a securing fastener.

19. The retention bracket of claim 18, wherein the securing fastener comprises a hook and loop member adapted to releasably retain the at least one networking component.

20. The retention bracket of claim 11, wherein the retaining panel is adjustable to receive at least one networking component having different dimensions than the at least one networking component.

* * * * *